United States Patent [19]

Gleason

[11] Patent Number: 5,012,186

[45] Date of Patent: Apr. 30, 1991

[54] ELECTRICAL PROBE WITH CONTACT FORCE PROTECTION

[75] Inventor: K. Reed Gleason, Portland, Oreg.

[73] Assignee: Cascade Microtech, Inc., Beaverton, Oreg.

[21] Appl. No.: 535,737

[22] Filed: Jun. 8, 1990

[51] Int. Cl.⁵ .............................................. G01R 31/02
[52] U.S. Cl. ................................ 324/158 P; 324/72.5; 324/158 F; 439/482
[58] Field of Search .................... 324/537, 72.5, 158 P, 324/158 F, 95; 439/482; 333/246, 247, 248

[56] References Cited

U.S. PATENT DOCUMENTS

| | | | |
|---|---|---|---|
| 3,648,169 | 3/1972 | Wiesler | 324/158 P |
| 3,810,017 | 5/1974 | Wiesler et al. | 324/158 P |
| 4,123,706 | 10/1978 | Roch | 324/158 P |
| 4,251,772 | 2/1981 | Worsham et al. | 324/158 P |
| 4,697,143 | 9/1987 | Lockwood et al. | 324/158 P |
| 4,758,785 | 7/1988 | Rath | 324/158 P |
| 4,849,689 | 7/1989 | Gleason et al. | 324/158 P |
| 4,888,550 | 12/1989 | Reid | 324/158 P |

FOREIGN PATENT DOCUMENTS 205759 1/1984 Fed. Rep. of Germany ... 324/158 P

OTHER PUBLICATIONS

Wagner et al, "Orbiting Probe", IBM Technical Bulletin, vol. 13, No. 7, Dec. 1970, pp. 2113-2114.
Graner et al, "Electrical Probe", IBM Technical Disclosure Bulletin, vol. 8, No. 12, May 1966, pp. 1722-1724.

Primary Examiner—Kenneth Wieder
Assistant Examiner—Vinh P. Nguyen
Attorney, Agent, or Firm—Chernoff, Vilhauer, McClung & Stenzel

[57] ABSTRACT

An electrical probe tip is yieldably mounted on a probe mount so that, as the probe mount and a device under test are advanced toward each other, the contact force between the probe tip and the device under test first increases gradually and then decreases. This prevents excessive contact force if the probe mount and device under test are inadvertently advanced excessively toward each other, and thereby prevents damage to the probe tip.

16 Claims, 1 Drawing Sheet

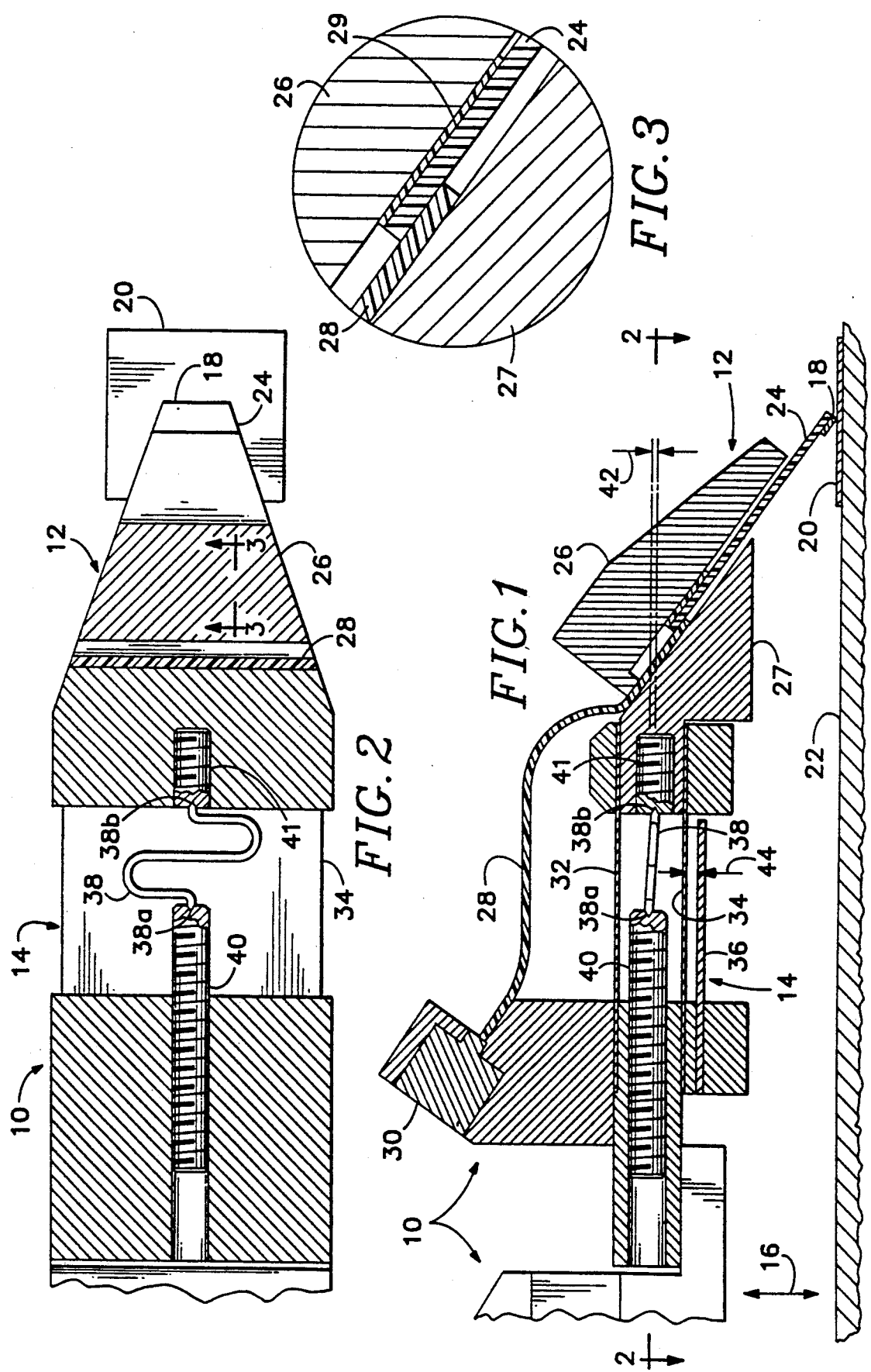

ELECTRICAL PROBE WITH CONTACT FORCE PROTECTION

BACKGROUND OF THE INVENTION

This invention relates to electrical probes, and particularly to microwave wafer probes.

Microwave wafer probes are well-known to the art, as exemplified by U.S. Pat. Nos. 4,697,143 and 4,849,689. Such probes have conductive probe tips which employ a dielectric substrate with printed planar conductors mounted thereon to form a controlled-impedance transmission line. One end of the probe tip is mounted in cantilevered fashion to a probe mount where it is attached to an electrical connector, while the other end of the probe tip contacts the device under test (DUT) to be probed. Contact between the probe tip and the DUT is accomplished by advancing either the probe mount or the DUT toward the other along a direction of advancement. When contact occurs, further advancement is used to establish a desired contact force, and the dielectric substrate bends to accommodate the advancement. As the advancement continues the contact force on the probe tip increases and, in the case of excessive advancement, the probe tip may become damaged due to excessive contact force. The substrate is mounted at an angle relative to the direction of advancement so that only the contact end of the probe tip actually contacts the DUT. Because of the angle, the contact end of the probe tip "skates" or slides forwardly on the DUT in a direction perpendicular to the direction of advancement as the contact force increases. A shallow probe tip angle, i.e. with the substrate extending generally normal to the direction of advancement, is usually necessary to minimize the magnitude of the skating, which is important because two or more probes are often used in conjunction on the DUT with their contact ends facing each other in close proximity (100 to 250 μm typically) so that excessive skating could cause the two tips to collide and damage each other. Also, if a wafer prob tip were mounted at a steep angle, the contact force on the conductive strips would be higher, because the substrate cannot bend as advantageously as the contact force increases, and would be more likely to cause damage because the force would be more in a direction parallel to the conductive strips, inducing shear forces to dislodge the conductive strips from the substrate.

Because excessive advancement between the probe mount and the DUT is particularly likely to cause wafer probe tip damage with a steeply-angled probe tip, most wafer probes employ shallow-angled probe tips. However, shallow-angled probe tips make it difficult for such probe tips to reach down into chip interconnect packages without encountering interference from the surrounding package structure.

The possibility of probe tip damage also exists with probe types other than wafer probes, such as needle probes. Some probe types, as exemplified by U.S. Pat. Nos. 3,648,169, 4,251,772, and 4,888,550, and by German patent No. 205,759, feature probe tips resiliently connected to a probe mount by means of springs which flex to enable the probe tip to move relative to the probe mount as the probe mount and DUT are advanced toward each other. The springs cause a gradual increase in the contact force between the probe tip and the DUT as the proximity of the probe mount and DUT increases. However, such arrangements retain the problem of excessive advancement and resultant excessive contact force.

U.S Pat. No. 4,123,706 employs a pneumatic piston which tends to keep the contact force constant throughout a range of advancement, thereby providing some protection against excessive contact force. However, such protection is provided only over a narrow range of advancement, beyond which the piston is displaced to its limit so that it is no longer operative to limit the contact force. The piston's imposition of a constant contact force, rather than a gradually increasing contact force with increasing advancement, significantly limits skating of the probe tip relative to the DUT. However, skating is used as a visual indication of probe contact (viewable through a microscope), and therefore a gradual increase in contact force causing a controlled degree of skating is desirable. Also, such a pneumatic piston arrangement is far more complex and expensive than a spring system for movably mounting the probe tip relative to the probe mount

SUMMARY OF THE PRESENT INVENTION

The present invention is directed to a wafer probe or other type of electrical probe which overcomes the foregoing drawbacks of the prior art. An interconnecting structure between the probe tip and the probe mount yieldably permits movement of the probe tip relative to the probe mount, along a direction substantially parallel to the direction of advancement between the probe mount and DUT, so that the contact force initially increases as the proximity between the probe mount and DUT increases through a first range of advancement. However, after a predetermined proximity is reached, the interconnecting structure prevents the contact force from increasing further, or at least significantly reduces the rate of force increase, even though the proximity may increase further through a second range of advancement even larger than the first. The initially increasing contact force causes flexure and resultant skating of the probe tip relative to the DUT as the proximity increases, which is desirable for providing a visual indication of probe contact. However, the contact force is prevented from reaching a level where probe tip damage can occur, even where the advancement is greatly excessive and even though the probe tip is steeply angled.

Preferably, the interconnecting structure actually causes a decrease in the contact force with further increases in proximity after the aforementioned predetermined rate of force increase to a negative rate). However, such decrease should not be such that the contact force itself becomes negative, i.e. such that the interconnecting structure tends to move the probe tip away from the DUT, because this would cause the probe tip to assume an erroneous equilibrium position which the probe user may not recognize and may inadvertently use as the position of the probe tip for initiating probing In such case, the contact force would increase slowly with increasing advancement, requiring a larger degree of advancement to obtain an adequate contact force, and would continue to increase with excessive advancement.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a sectional side view of an exemplary embodiment of a probe constructed in accordance with the present invention.

FIG. 2 is a sectional view taken along line 2—2 of FIG. 1.

FIG. 3 is a sectional partial detail view taken along line 3—3 of FIG. 2.

DETAILED DESCRIPTION OF THE INVENTION

With reference to FIGS. 1 and 2, an exemplary embodiment of a probe in accordance with the present invention comprises a probe mount 10 and a probe tip assembly 12 interconnected by a spring assembly 14. The interconnecting spring assembly 14 permits movement of the probe tip assembly 12 relative to the probe mount 10 along a short, curved, vertical path which is substantially parallel to a direction of advancement 16. The purpose of the probe is to cause the contact end 18 of the probe tip assembly 12 to contact an electrical circuit on a DUT 20, which is in turn mounted on a chuck 22. Contact of the probe tip assembly 12 with the DUT 20 is accomplished by movement of either the chuck 22 or the probe mount 10 toward the other along the direction of advancement 16.

Considering the major elements of the probe in greater detail, the probe tip assembly 12 comprises a relatively stiff, but still flexible, thin dielectric substrate 24 on the underside of which are mounted printed planar conductors forming a coplanar controlled-impedance transmission line having overlying grooved microwave-absorbing material 26, 27, as described more fully in U.S. Pat. No. 4,697,143 which is incorporated herein by reference. The controlled-impedance transmission line on the substrate 24 is connected electrically, by a highly flexible microstrip transmission line 28 and a coaxial electrical connector 30 on the probe mount 10, to appropriate test equipment such as a network analyzer (not shown). As shown in FIG. 3, the substrate 24 is spaced from the absorbing material 26 by a dielectric spacer 29, and from the absorbing material 27 by the microstrip 28, to provide adequate clearance for flexing and resultant skating of the substrate 24. The probe mount 10 and chuck 22 are both mounted on a probe station (not shown) which provides for controlled movability of one with respect to the other along the direction of advancement 16 in a conventional manner.

The interconnecting spring assembly 14 has four spring components (not including the planar transmission line 28 which is sufficiently flexible to provide only negligible resistance to movement between the probe tip assembly 12 and the probe mount 10). Two of the spring components are relatively thin, cantilevered, dual beam springs 32 and 34 capable of flexing upwardly or downwardly from their neutral horizontal positions to permit vertical movement of the probe tip assembly 12 relative to the probe mount 10 in FIG. 1, while yieldably resisting such movement. The resisting spring force applied by the dual beam springs 32 and 34 is significantly less than the spring force applied by the other two springs in the system, i.e. the stiffer cantilevered beam spring 36 and compression spring 38. Besides being stiffer than the dual beam springs 32 and 34, the beam spring 36 is not rigidly connected to the probe tip assembly 12 as are the springs 32 and 34, but rather is capable only of abutting against the underside of the spring 34 to oppose downward, but not upward, motion of the probe tip assembly 12 relative to the probe mount 10. The compression spring 38 is interposed compressively between an adjusting screw 40, threadably mounted in the probe mount 10, and a set screw 41 mounted in the absorber material 27 of the probe tip assembly 12. As seen in FIG. 1, its orientation is such that it exerts a compressive force along a direction which is substantially normal to the direction of advancement 16.

Although the spring 38 as shown in FIGS. 1 and 2 is depicted merely as a simple wire spring, any suitable form of compression spring could be utilized, such as a more conventional helical coil spring. Likewise, even though the beam springs 32, 34 and 36 are considered to be the most suitable for this application, alternative types of springs could be used to perform their functions as well.

The compression spring 38 is attached at one end 38a to the adjusting screw 40 and at the other end 38b to the set screw 41 in the absorber material 27 by insertion of the ends into shallow recesses in the screws 40 and 41, respectively, so that the spring 38 can pivot freely upwardly and downwardly with respect to each end connection point. The end 38a, where the spring attaches to the screw 40, is offset upwardly with respect to the end 38b when the dual beam springs 32, 34 are undeflected (i.e. horizontal as shown in FIG. I). This offset in height between the two ends of the spring 38 is indicated by the offset distance 42 in FIG. 1. Before use of the probe, the adjusting screw 40 is tightened so as to impose compressive force on the spring 38 which, due to the offset distance 42, includes a downward component which deflects beam springs 32 and 34 downwardly and, when spring 36 is contacted by the underside of spring 34, likewise deflects spring 36 downwardly. Although a clearance 44 is shown in FIG. 1 between spring 36 and the underside of spring 34 prior to the imposition of compressive force on spring 38, it is not critical to operability that such clearance be provided. The compressive preloading of spring 38 by tightening of the screw 40 places the interconnecting spring assembly 14 in a downwardly preloaded position in which the downward component of the compressive force of spring 38 is resisted by the upward spring forces of springs 32, 34 and 36 in combination.

Thereafter, either the probe mount 10 is lowered along the direction of advancement 16, or the chuck 22 is raised along the direction of advancement, so that the contact end 18 of the probe tip assembly 12 is brought into contact with the electrical circuit on the DUT 20. As soon as contact is made, a compressive contact force between the contact end 18 and the DUT 20 develops, and such contact force is added to the forces of springs 32, 34 and 36 opposing the downward compressive force component of spring 38. This causes deflection of the probe tip assembly 12 relative to the probe mount 10 in an upward direction generally parallel to the direction of advancement 16. Thereafter, as the probe mount 10 continues to advance toward the DUT 20 along the direction of advancement 16, the contact force gradually increases as determined principally by the increasing deformation of spring 38 and the decreasing deformation of spring 36 as the probe tip assembly 12 deflects upwardly. If advancement of the probe mount 10 toward the DUT 20 continues, eventually the probe tip assembly 12 will be deflected upwardly relative to the probe mount 10 to the position shown in FIG. 1 where the springs 32, 34 and 36 no longer oppose the spring 38 because they are no longer deflected downwardly, and the contact force alone opposes the spring 38. This substantially marks the limit of the desirable range of advancement.

Further advancement of the probe mount 10 along the direction of advancement 16 causes further upward deflection of the probe tip assembly 12 relative to the probe mount 10. This causes the dual beam springs 32, 34 to begin to be deflected upwardly, thereby exerting a downward force on the probe tip assembly rather than an upward force, and marks the beginning of the range of excessive advancement. As soon as the upward deflection equals the offset distance 42, however, the end 38b of the spring 38 becomes level with the end 38a so that the spring 38 no longer is capable of applying a downward compressive force component against the probe tip assembly 12. Thereafter, further excessive advancement of the probe mount 10 relative to the DUT 20 raises the end 38b of the spring 38 above the level of its opposite end 38a so that the spring 38 begins to exert an upward compressive force on the probe tip assembly 12, thereby resisting the downward force exerted by the upwardly-deflected dual beam springs 32, 34 in concert with the contact force. Because the dual springs 32 and 34 are relatively weak, this causes not merely a reduction in the rate of contact force increase (which would itself tend to protect the probe tip from damage) but an actual decrease in the contact force. The contact force decreases further with further advancement of the probe mount 10 toward the DUT 20 since the resultant further upward deflection of the probe tip assembly 12 relative to the probe mount 10 increases the upward compressive force component of the spring 38 due to the increasing upward offset of spring end 38b relative to end 38a. Finally, after a range of excessive advancement much greater than the initial desirable range of advancement during which the contact force initially increased, the contact force could once again begin to increase, but by then the operator is likely to have noticed his error.

At no time during such excessive advancement should the upward force component of the spring 38 exceed the downward force exerted by the dual beam springs 32, 34, because such a result would cause the probe tip assembly 12 to snap upwardly into a stable condition which might not be recognized by the operator and which therefore might erroneously become the starting point for the probe tip assembly when it is later advanced into contact with another DUT.

During the initial desirable advancement range, as the contact force gradually increases, the contact end 18 of the probe tip assembly 12 skates forwardly along the DUT 20, enabling the operator to detect visually, through a microscope, that contact has occurred and that the probe tip is within the intended range of contact force. However, should the operator inadvertently continue to advance the probe mount 10 toward the DUT 20 excessively, the rearwardly arced path of the probe tip together with the decrease in contact force will cause backward skating of the contact end 18 of the probe tip assembly, enabling the operator to visually detect the excessive advancement and make a correction by retracting the probe mount 10 until it is once more in the range where further advancement causes forward skating. However, such decrease in contact force, although desirable, is not critical to the invention.

A spring system which merely reduces the rate of increase of the contact force, or prevents a further increase in the contact force, in response to excessive advancement would still function to protect the probe tip assembly from damage and is within the scope of the invention.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe for testing an electrical circuit on a device under test, said probe comprising:
   (a) a probe mount;
   (b) a conductive probe tip attached to said probe mount for electrically contacting said device under test with a contact force by movement of at least one of said probe mount and said device under test toward the other along a direction of advancement, said probe mount and said device under test having a spatial proximity relative to each other along said direction of advancement which increases with said movement;
   (c) interconnecting means movably attaching said probe tip to said probe mount for permitting movement of said probe tip relative to said probe mount substantially parallel to said direction of advancement;
   (d) said interconnecting means including means automatically responsive to said spatial proximity, along said direction of advancement, between said probe mount and said device under test for increasing said contact force as said spatial proximity increases to a predetermined spatial proximity through a first range of advancement, and thereafter substantially preventing a further increase in said contact force as said spatial proximity increases beyond said predetermined spatial proximity through a second range of advancement.

2. The probe of claim 1 wherein said interconnecting means includes means for decreasing said contact force as said spatial proximity increases further beyond said predetermined spatial proximity.

3. The probe of claim 1 wherein said means automatically responsive to said spatial proximity includes means for selectively urging said probe tip relative to said probe mount alternatively in either of two opposite directions substantially parallel to said direction of advancement, depending upon the movable portion of said probe tip relative to said probe mount.

4. The probe of claim 1 wherein said interconnecting means comprises a compression spring interposed compressively between said probe mount and said probe tip for exerting a compressive force along a direction which is substantially normal to said direction of advancement.

5. The probe of claim 1 wherein said probe tip extends in a cantilevered fashion along a direction which is at an angle relative to said direction of advancement.

6. The probe of claim 5 wherein said probe tip comprises multiple planar conductors mounted on a planar dielectric substrate so as to form a controlled impedance transmission line.

7. A probe for testing an electrical circuit on a device under test, said probe comprising:
(a) a probe mount;
(b) a conductive probe tip attached to said probe mount for electrically contacting said device under test with a contact force by movement of at least one of said probe mount and said device under test toward the other along a direction of advancement, said probe mount and said device under test having a spatial proximity relative to each other along said direction of advancement which increases with said movement;
(c) interconnecting means movably attaching said probe tip to said probe mount for permitting movement of said probe tip relative to said probe mount substantially parallel to said direction of advancement;
(d) said interconnecting means including a spring automatically responsive to said spatial proximity, along said direction of advancement, between said probe mount and said device under test for preventing an increase in said contact force as said spatial proximity increases through a range of advancement beyond a predetermined spatial proximity.

8. The probe of claim 7 wherein said spring includes means for decreasing said contact force as said spatial proximity increases beyond said predetermined spatial proximity.

9. The probe of claim 7 wherein said spring includes means for selectively urging said probe tip relative to said probe mount alternatively in either of two opposite directions substantially parallel to said direction of advancement, depending upon the movable position of said probe tip relative to said probe mount.

10. The probe of claim 7 wherein said spring comprises a compression spring interposed compressively between said probe mount and said probe tip for exerting a compressive force along a direction which is substantially normal to said direction of advancement.

11. The probe of claim 7 wherein said probe tip extends in a cantilevered fashion along a direction which is at an angle relative to said direction of advancement.

12. The probe of claim 11 wherein said probe tip comprises multiple planar conductors mounted on a planar dielectric substrate so as to form a controlled impedance transmission line.

13. A probe for testing an electrical circuit on a device under test, said probe comprising:
(a) a probe mount;
(b) a conductive probe tip attached to said probe mount for electrically contacting said device under test with a contact force by movement of at least one of said probe mount and said device under test toward the other along a direction of advancement, said probe mount and said device under test having a spatial proximity relative to each other along said direction of advancement which increases with said movement;
(c) interconnecting means movably attaching said probe tip to said probe mount for permitting movement of said probe tip relative to said probe mount substantially parallel to said direction of advancement;
(d) said interconnecting means including means automatically responsive to said spatial proximity, along said direction of advancement, between said probe mount and said device under test for establishing a first rate of increase in said contact force as said spatial proximity increases to a predetermined spatial proximity through a first range of advancement, and thereafter establishing a second rate of increase in said contact force which is less than said first rate of increase as said spatial proximity increases beyond said predetermined spatial proximity through a second range of advancement which is greater than said first range of advancement.

14. The probe of claim 13 wherein said interconnecting means includes means for establishing said second rate of increase in said contact force as a negative rate, and thereby decreasing said contact force as said spatial proximity increases beyond said predetermined spatial proximity through said second range of advancement.

15. A probe for testing an electrical circuit on a device under test, said probe comprising:
(a) a probe mount;
(b) a conductive probe tip attached to said probe mount for electrically contacting said device under test with a contact force by movement of at least one of said probe mount and said device under test toward the other along a direction of advancement;
(c) interconnecting means movably attaching said probe tip to said probe mount for permitting movement of said probe tip relative to said probe mount substantially parallel to said direction of advancement;
(d) said interconnecting means including means automatically responsive to the movable position of said probe tip relative to said probe mount for selectively urging said probe tip relative to said probe mount alternatively in either of two opposite directions substantially parallel to said direction of advancement, depending upon the movable position of said probe tip relative to said probe mount.

16. The probe of claim 15 wherein said means for selectively urging said probe tip comprises a compression spring interposed compressively between said probe mount and said probe tip.

* * * * *

UNITED STATES PATENT AND TRADEMARK OFFICE
CERTIFICATE OF CORRECTION

PATENT NO. : 5,012,186

DATED : April 30, 1991

INVENTOR(S) : K. Reed Gleason

It is certified that error appears in the above-identified patent and that said Letters Patent is hereby corrected as shown below:

Col. 2, line 51, After "predetermined" insert --proximity has been reached (by reducing the --.

Signed and Sealed this

Fifth Day of October, 1993

Attest:

BRUCE LEHMAN

Attesting Officer

Commissioner of Patents and Trademarks